(12) United States Patent
Oo

(10) Patent No.: US 8,638,128 B1
(45) Date of Patent: *Jan. 28, 2014

(54) METHOD AND APPARATUS FOR SAMPLING

(75) Inventor: Kenneth Thet Zin Oo, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/473,086

(22) Filed: May 16, 2012

Related U.S. Application Data

(63) Continuation of application No. 12/552,543, filed on Sep. 2, 2009, now Pat. No. 8,183,890.

(60) Provisional application No. 61/095,777, filed on Sep. 10, 2008.

(51) Int. Cl.
*G11C 27/02* (2006.01)
*H03K 5/00* (2006.01)
*H03K 17/00* (2006.01)

(52) U.S. Cl.
USPC .......................................................... 327/94

(58) Field of Classification Search
USPC .................................................. 327/91, 94–97
See application file for complete search history.

(56) References Cited

U.S. PATENT DOCUMENTS

| 5,013,942 | A | 5/1991 | Nishimura et al. |
| 5,463,285 | A | 10/1995 | El-Hamamsy |
| 6,052,000 | A | 4/2000 | Nagaraj |
| 6,323,697 | B1 | 11/2001 | Pavan |
| 6,504,406 | B1 | 1/2003 | Kakitani |
| 6,696,883 | B1 | 2/2004 | Wilson |
| 7,183,814 | B2 | 2/2007 | Kudo |
| 7,274,222 | B2 | 9/2007 | Alacoque et al. |
| 7,453,291 | B2 | 11/2008 | Song |
| 7,710,164 | B1 | 5/2010 | Sharma |
| 7,724,042 | B2 * | 5/2010 | Mathur et al. .................. 327/91 |
| 8,030,974 | B1 | 10/2011 | Oo |
| 2003/0043936 | A1 | 3/2003 | Forbes |
| 2006/0049857 | A1 * | 3/2006 | Song .............................. 327/94 |
| 2007/0013417 | A1 | 1/2007 | Lim |

* cited by examiner

*Primary Examiner* — Quan Tra

(57) ABSTRACT

Aspects of the disclosure provide a sampling circuit with reduced sampling distortions. The sampling circuit can include a switch and a first driving module configured to drive a first signal in response to an input signal onto a first channel terminal of the switch. The sampling circuit also can include a bootstrap module coupled to a control terminal of the switch and a second driving module coupled to the bootstrap module. The second driving module can be configured to drive a second signal in response to the input signal to the bootstrap module, such that the bootstrap module can vary a control voltage on the control terminal based on the input signal for turning on the switch and causing an output voltage on a second channel terminal of the switch to track the first signal on the first channel terminal of the switch.

12 Claims, 4 Drawing Sheets

METHOD AND APPARATUS FOR SAMPLING

INCORPORATION BY REFERENCE

This application is a continuation application of U.S. patent application Ser. No. 12/552,543 filed on Sep. 2, 2009, which claims the benefit of U.S. Provisional Application No. 61/095,777, "Use of Auxiliary Buffer for Track-and-Hold Circuit" filed on Sep. 10, 2008. The disclosure of prior applications is hereby incorporated by reference herein in their entireties.

BACKGROUND

Sampling circuits can be used in integrated circuits for various purposes. For example, a sampling circuit may be used in an analog to digital converter (ADC) module. The sampling circuit may acquire an analog value, and hold the analog value for other portions of the ADC module to convert the analog value to a digital value. Generally, a sampling circuit may introduce sampling distortions due to various non-idealities, such as variable on-resistance, channel charge depletion, sampling aperture jitter, clock feed-through, data feed-through, and the like. The sampling distortions may affect, for example, a resolution of the ADC module.

SUMMARY

Aspects of the disclosure can provide a sampling circuit with reduced sampling distortions. The sampling circuit can include a switch having a control terminal, a first channel terminal and a second channel terminal. Further, the sampling circuit can include a first driving module configured to receive an input signal and drive a first signal in response to the input signal onto the first channel terminal of the switch. In addition, the sampling circuit can include a bootstrap module coupled to the control terminal of the switch, and a second driving module coupled to the bootstrap module. The second driving module can be configured to receive the input signal and drive a second signal in response to the input signal onto the bootstrap module, such that the bootstrap module varies a control voltage on the control terminal of the switch based on the input signal for turning on the switch in a track-mode and causing an output voltage on the second channel terminal of the switch to track the first signal on the first channel terminal of the switch.

According to an embodiment of the disclosure, the bootstrap module can vary the control voltage on the control terminal of the switch with a substantially constant voltage difference to the second signal. In addition, the first driving module can be configured to drive the first signal substantially equivalent to the input signal, and the second driving module can be configured to drive the second signal substantially equivalent to the input signal.

According to an aspect of the disclosure, the first driving module can include one or more analog buffers. Similarly, the second driving module can include one or more analog buffers.

In an embodiment, the first driving module can be configured to drive the first signal substantially equivalent to the input signal and with a higher accuracy than the second driving module driving the second signal. In addition, the first driving module can be configured to drive the first signal substantially equivalent to the input signal with a higher power than the second driving module driving the second signal.

In an example, the switch can include at least one of an n-type metal oxide semiconductor (MOS) transistor and a p-type MOS transistor.

Aspects of the disclosure can provide a method for sampling. The method can include receiving an input signal, driving a first signal based on the input signal to a first channel terminal of a switch, driving a second signal based on the input signal to a bootstrap module coupled to a control terminal of the switch, bootstrapping the control terminal based on the second signal to turn on the switch and form a conducting channel between the first channel terminal and a second channel terminal of the switch, and outputting an output signal from the second terminal of the switch that tracks the first signal.

Further, the method can include controlling the control terminal to turn off the switch to hold a sample of the first signal on the second terminal of the switch.

To drive the first signal based on the input signal to the first channel terminal of the switch, the method can include driving the first signal substantially equivalent to the input signal onto the first channel terminal of the switch.

To drive the second signal based on the input signal to the bootstrap module coupled to the control terminal of the switch, the method can include driving the second signal substantially equivalent to the input signal onto the bootstrap module.

In an embodiment, the method can include driving the first signal substantially equivalent to the input signal and with a higher accuracy than driving the second signal. Similarly, the method can include driving the first signal substantially equivalent to the input signal and with a higher power than driving the second signal.

Aspects of the disclosure can provide an integrated circuit (IC) chip. The IC chip can include an analog to digital converter configured to convert samples of an input signal into digital values, and a sampling circuit configured to receive the input signal, sample the input signal with regard to sampling instants of a sampling clock signal, and provide the samples to the analog to digital converter. The sampling circuit can further include a switch having a control terminal, a first channel terminal and a second channel terminal. Further, the sampling circuit can include a first driving module configured to receive an input signal and drive a first signal in response to the input signal onto the first channel terminal of the switch. In addition, the sampling circuit can include a bootstrap module coupled to the control terminal of the switch and a second driving module coupled to the bootstrap module. The second driving module can be configured to receive the input signal and drive a second signal in response to the input signal to the bootstrap module. Thus, the bootstrap module can vary a control voltage on the control terminal of the switch based on the input signal for turning on the switch in a track-mode and causing an output voltage on the second channel terminal of the switch to track the first signal on the first channel terminal of the switch.

In an embodiment, the bootstrap module can vary the control voltage on the control terminal of the switch with a substantially constant voltage difference to the second signal.

Further, the first driving module can be configured to drive the first signal substantially equivalent to the input signal and with a higher accuracy than the second driving module driving the second signal. In addition, the first driving module can be configured to drive the first signal substantially equivalent to the input signal and with a higher power than the second driving module driving the second signal.

BRIEF DESCRIPTION OF THE DRAWINGS

Various exemplary embodiments of this disclosure will be described in detail with reference to the following figures, wherein like numerals reference like elements, and wherein.

DETAILED DESCRIPTION OF EMBODIMENTS

Figure 1:
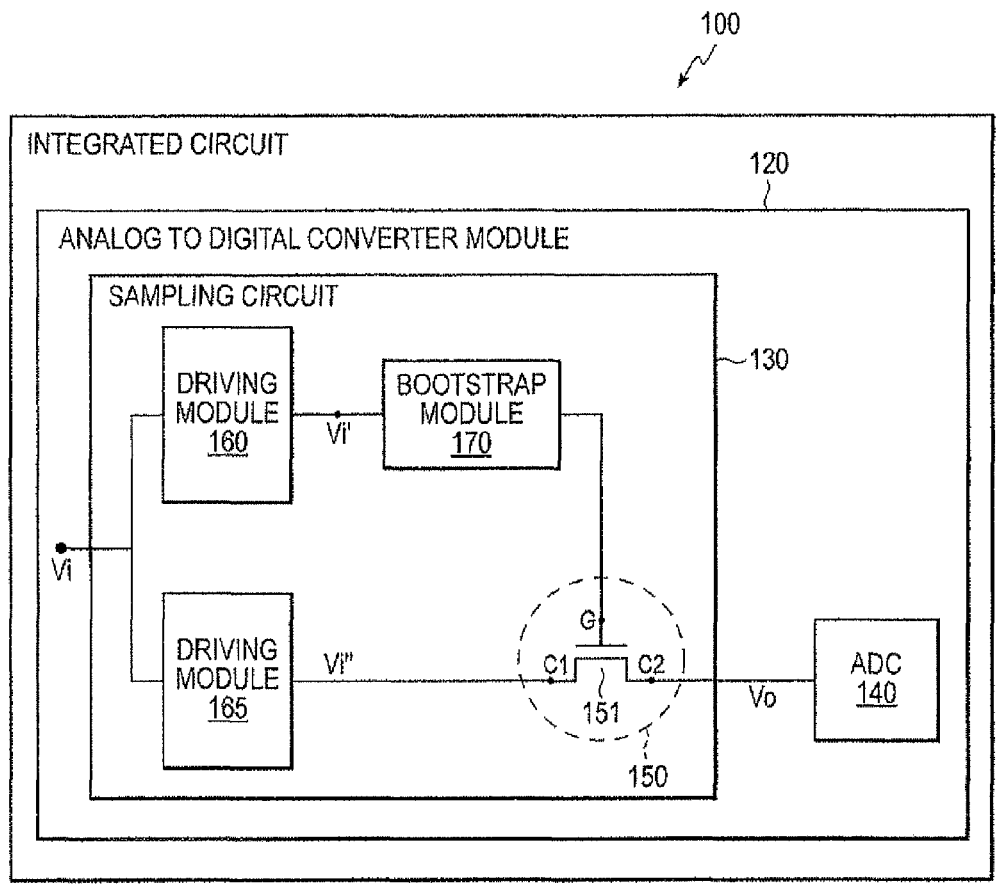
FIG. 1 shows a block diagram of an integrated circuit (IC) chip according to an embodiment of the disclosure.

FIG. 1 shows a block diagram of an integrated circuit (IC) chip in accordance with an embodiment of the disclosure. The IC chip 100 can include a sampling circuit 130, for example, as a portion of an analog to digital converter module 120. The analog to digital converter module 120 may include an analog to digital converter 140 coupled to the sampling circuit 130. The analog to digital converter 140 may receive a sampled analog value from the sampling circuit 130, and convert the sampled analog value to a digital value. According to the disclosure, the sampling circuit 130 can be configured to receive an input signal Vi, and output a signal Vo that can be samples of the input signal Vi. The output signal Vo can have reduced sampling distortions, thus the analog to digital converter module 120 may have an increased resolution. The sampling circuit 130 may include a switch module 150, a bootstrap module 170, a first driving module 160, and a second driving module 165. These elements can be coupled together as shown in FIG. 1.

The first driving module 160 may include any suitable components, and can be configured to receive the input signal Vi, and drive a signal Vit based on the input signal Vi. In an embodiment, the signal Vit can be substantially the same as the input signal Vi. However, the signal Vi' may have an error difference to the input signal Vi due to various reasons, such as non-idealities, noises, and the like.

The second driving module 165 may include any suitable components, and can be configured to receive the input signal Vi, and drive a signal Vi" based on the signal input Vi. In an embodiment, the signal Vi" can be substantially the same as the input signal Vi. Similarly, the signal Vi" can have an error difference to the input signal Vi due to various reasons.

In an embodiment, the second driving module 165 can be configured to have higher accuracy than the first driving module 160. In addition, the second driving module 165 can be configured to have lower noises than the first driving module 160. Thus, the error difference between the signal Vi" to the input signal Vi can be smaller than the error difference between the signal Vi' and the input signal Vi. For example, the second driving module 165 can be configured to provide the signal Vi" having less than 0.1% error difference to the input signal Vi, while the first driving module 160 can be configured to provide the input signal Vi having less than 1% error difference to the input signal Vi.

The bootstrap module 170 can receive the signal Vi', and adjust a control voltage Vg based on the signal Vi' to control operations of the switch module 150. The control voltage Vg may vary with the signal Vi', for example, during a tracking duration. In an embodiment, the control voltage Vg can have a substantially constant voltage difference to the signal Vi' during a tracking duration.

The switch module 150 can include one or more transistors of any suitable types, such as n-type metal oxide semiconductor field effect transistor (MOSFET), p-type MOSFET, and the like. In addition, the one or more transistors may be configured in various manners. In an example, the switch module 150 may include a single n-type or p-type MOS transistor configured as a single-transistor switch module. In another example, the switch module 150 may include an n-type MOS transistor and a p-type MOS transistor coupled together to form a transmission-gate-type switch module. In another example, the switch module 150 may include two n-type MOS transistors, or two p-type MOS transistors that can be configured in a differential manner to form a differential-type switch module. It is noted that the present disclosure describes methods and circuits with a switch module example having a single n-type MOS transistor for ease and clarity, the methods and circuits can be suitably adjusted for use in other types of switch modules.

The switch module 150 may include a control terminal, a first channel terminal and a second channel terminal. The control terminal can be configured to turn on or turn off a conducting channel between the first channel terminal and the second channel terminal. In the FIG. 1 example, the switch module 150 can include an n-type MOS transistor 151. The n-type MOS transistor 151 can include a gate terminal G, a first channel terminal C1, and a second channel terminal C2. The gate terminal G can receive the control voltage Vg as the gate voltage. The gate voltage Vg may vary with regard to the signal Vi' during a tracking duration. Due to the reason that the signal Vi' can be driven based on the input signal Vi, the gate voltage Vg may vary with the input signal Vi during the tracking duration. The first channel terminal C1 can receive the signal Vi", which can also vary based on the input signal Vi. The second channel terminal C2 can be coupled to an output node for outputting the signal Vo.

The n-type MOS transistor 151 can be configured into a track-mode or a hold-mode by adjusting the gate voltage Vg on the gate terminal G. More specifically, when the gate voltage Vg on the gate terminal G satisfies a channel forming condition, for example, being higher than a voltage on the first terminal C1 by at least a threshold voltage of the n-type MOS transistor 151, a conducting channel can be turned on between the first channel terminal C1 and the second channel terminal C2, and the n-type MOS transistor 151 can be configured in the track-mode. In the track-mode, the output voltage Vo on the second channel terminal C2 may track the voltage Vi" on the first channel terminal C1. In other words, the output voltage Vo can be substantially equivalent to the voltage Vi".

On the other hand, when the gate voltage Vg on the gate terminal G does not satisfy the channel forming condition, for example, not being higher than voltages on the first channel terminal C1 and the second channel terminal C2 by the threshold voltage of the n-type MOS transistor 151, the conducting channel between the first terminal C1 and the second channel terminal C2 can be turned off, and the n-type MOS transistor 151 can be configured in the hold-mode. In the hold-mode, the output voltage Vo on the second channel terminal C2 can maintain the substantially same value acquired from the voltage Vi" at a sampling instant, at which the gate voltage Vg of the gate terminal G changes, for example, from satisfying the channel forming condition to not-satisfying the channel forming condition.

During operation, the sampling circuit 130 can receive the input signal Vi. Then, the input signal Vi can be driven to the switch module 150 via a first path and a second path. The first path can include the first driving module 160 and the bootstrap module 170 that can adjust the gate voltage Vg based on the input signal Vi. The second path can include the second driving module 165 that can provide the voltage Vi" for sampling based on the input signal Vi. The first driving module 160 and the second driving module 165 can decouple the gate voltage Vg with the voltage Vi" for sampling, and can be configured respectively to meet requirement of the gate voltage Vg and the voltage Vi" for sampling.

In an embodiment, the second driving module 165 can be configured to drive the voltage Vi" for sampling by considering the resolution requirement of the voltage Vi". For example, when the ADC 140 is a 10-bit ADC converter, the second driving module 165 can be configured to drive the voltage Vi" with less than 0.1% error difference. On the other hand, the first driving module 160 can be configured to meet the driving requirement of the gate voltage Vg. For example, the first driving module 160 can be configured to drive the voltage Vi' with 1% error difference to the input signal Vi to meet the driving requirement of the gate voltage Vg. Using the decoupling design, the second driving module 165 may not need to be over-designed to take care what happens to the gate voltage Vg.

It is noted that the various components shown in the IC chip 100 can be implemented in separate chips, and suitably coupled together.

Figure 2:
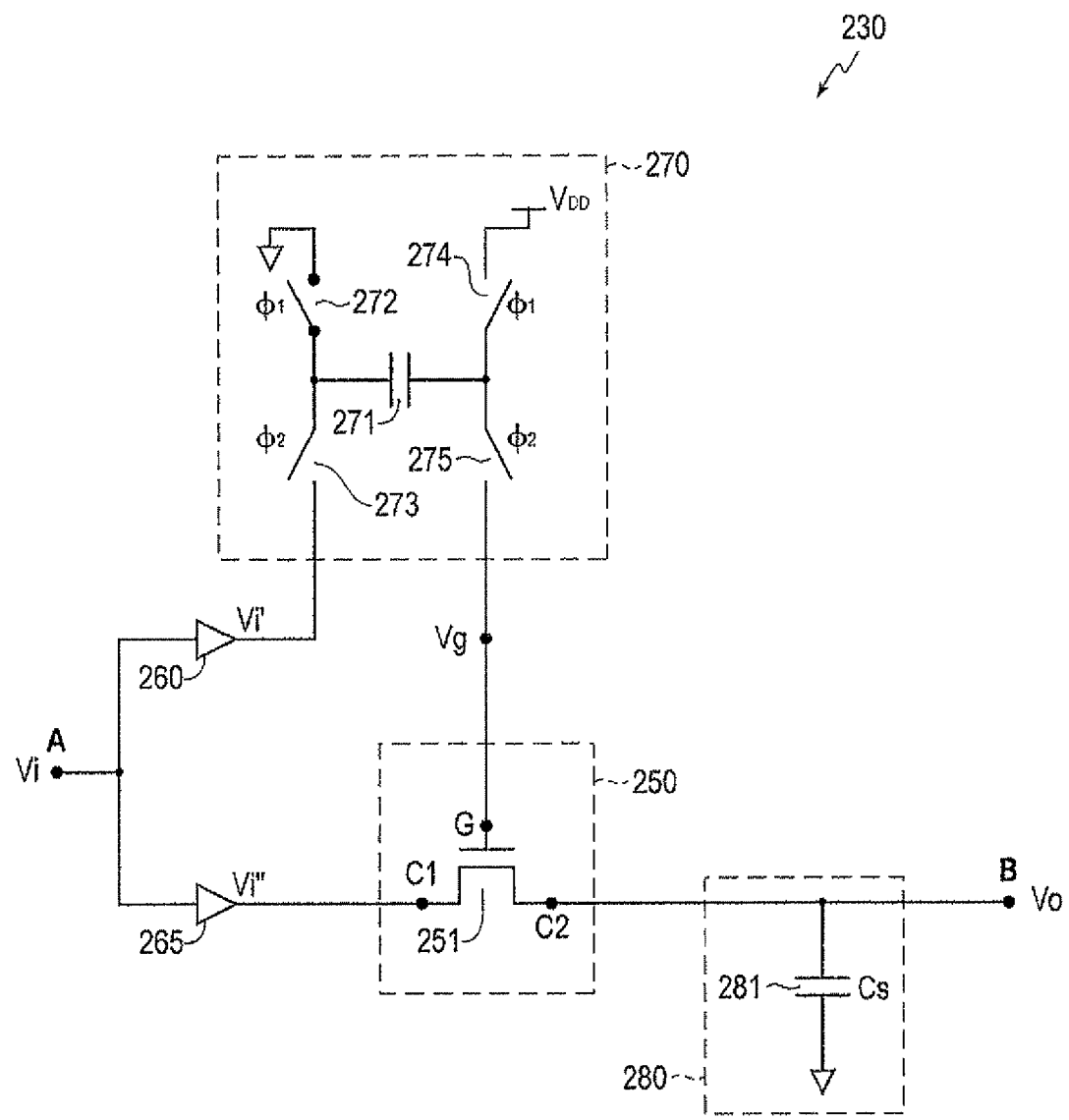
FIG. 2 shows a block diagram of a sampling circuit according to an embodiment of the disclosure.

FIG. 2 shows a block diagram of a sampling circuit according to an embodiment of the disclosure. The sampling circuit 230 can receive an input signal Vi, and output a signal Vo. The sampling circuit 230 can include a switch module 250, a sampling capacitor module 280, a bootstrap module 270, a first buffer 260 and a second buffer 265. These elements can be coupled together as shown in FIG. 2.

The first buffer 260 may be an analog buffer that can receive the input signal Vi, and drive a signal Vi' based on the input signal Vi. In an embodiment, the first buffer 260 can be suitably configured, such that the signal Vi' can be substantially the same as the input signal Vi. However, the signal Vi' may have an error difference to the input signal Vi due to various reasons, such as non-idealities, noises, and the like.

The second buffer 265 may also be an analog buffer that can receive the input signal Vi, and can drive a signal Vi" based on the signal input Vi. In an embodiment, second buffer 265 can be suitable configured, such that the signal Vi" can be substantially the same as the input signal Vi. Similarly, the signal Vi" can have an error difference to the input signal Vi due to various reasons.

In an embodiment, the second buffer 265 can be configured as a high-accuracy and low-noise analog buffer, thus the signal Vi" can have a small error difference to the input signal Vi. On the other hand, the first buffer 260 can be implemented using as an analog buffer having a reduced accuracy and a reduced power.

The bootstrap module 270 can receive the signal Vi' and adjust a control voltage Vg based on the signal Vi' to control operations of the switch module 250. The control voltage Vg may vary with the signal Vi'. In an embodiment, the control voltage Vg can have a substantially constant voltage difference to the signal Vi' during a time duration, such as a tracking duration.

In an example, the bootstrap module 270 can include a capacitor 271, a first switch 272, a second switch 273, a third switch 274, and a fourth switch 275 coupled together as shown in FIG. 2. The first switch 272 and the third switch 274 can be controlled to switch on or switch off in response to a first clock signal φ1. For example, when the first clock signal φ1 is logic "1", the first switch 272 and the third switch 274 can be switched on, and then the capacitor 271 can be coupled to a charger, as shown by Vdd and ground in FIG. 2, to be charged to a substantially constant voltage.

The second switch 273 and the fourth switch 275 can be controlled to switch on or switch off in response to a second clock signal φ2. For example, when the second clock signal φ2 is logic "1", the second switch 273 and the fourth switch 275 can be switched on, and then the capacitor 271 can be coupled to the switch module 250.

The switch module 250 can include an n-type MOS transistor 251. The n-type MOS transistor 251 can have a gate terminal G, a first channel terminal C1 and a second channel terminal C2. The first channel terminal C1 can be coupled to the second buffer 265 for receiving the signal Vi". The second channel terminal C2 can be coupled to a node B for outputting the voltage Vo. The gate terminal G can be used to configure the n-type MOS transistor 251 into a track-mode or a hold-mode. In the track-mode, the voltage Vo can track the signal Vi"; and in the hold-mode, the signal Vo can hold a sample of the voltage Vi" acquired at a sampling instant.

The sampling capacitor module 280 can include any suitable circuits that can be configured to hold a sample. In an example, the sampling capacitor module 280 can include a sampling capacitor Cs 281 coupled between the node B and ground.

In the FIG. 2 example, the n-type MOS transistor 251 can be configured, such as into the track-mode, into the hold-mode, and having a sampling instant, according to the second clock signal φ2. For example, when the second clock signal φ2 is logic "0", the n-type MOS transistor 251 can be configured into the hold-mode; when the second clock signal is logic "1", the n-type MOS transistor 251 can be configured into the track-mode; and when the second clock signal φ2 changes from logic "1" to logic "0", the n-type MOS transistor 251 can be configured to have a sampling instant.

The first clock signal φ1 can be non-overlapping with the second clock signal φ2, and can work with the second clock signal φ2 to control the bootstrap module 270. More specifically, when the first clock signal φ1 is logic "1", and the second clock signal φ2 is logic "0", the first switch 272 and third switch 274 can be switched on and the second switch 273 and the fourth switch 275 can be switched off. Thus, the capacitor 271 can be coupled to the charger. The charger can charge the capacitor 271 to have the substantially constant voltage difference, for example, Vdd, between a first terminal and a second terminal of the capacitor 271.

It is noted that the gate voltage Vg may be controlled by other suitable components (not shown) when the second clock signal φ2 is logic "0" and the n-type MOS transistor 251 can be configured in the hold-mode.

On the other hand, when the second clock signal φ2 is logic "1", and the first clock signal φ1 is logic "0", the first switch 272 and third switch 274 can be switched off and the second switch 273 and the fourth switch 275 can be switched on. Thus, the capacitor 271 can be coupled between the first buffer 260 and the n-type MOS transistor 251. The first buffer 260 can drive the capacitor 271. Then, the substantially constant voltage difference, for example, Vdd, can be applied between the first buffer 260 and the gate terminal G of the n-type MOS transistor 251. As a result, the gate voltage Vg of the n-type MOS transistor 251 can be substantially equivalent to Vi'+Vdd.

Due to the reason that the signal Vi' is substantially the same as the input signal Vi, further the signal Vi" on the first channel terminal C1 of the n-type MOS transistor 251 can be substantially the same as the input signal Vi, the voltage difference between the gate voltage Vg and the first channel terminal C1 can be substantially equivalent to Vdd. Therefore, the n-type MOS transistor 251 can be configured into the track-mode, and have a conducting channel between the first channel terminal C1 and the second channel terminal C2. The conducting channel can enable the second buffer 265 to drive the sampling capacitor Cs 281 to vary according to the input signal Vi.

It is noted that the capacitor 271 and the capacitor 281 can be driven by different driving modules when the second clock signal φ2 is logic "1" and the n-type MOS transistor 251 is configured in the track-mode. The capacitor 271 can be driven by the second buffer 265, and the capacitor 281 can be driven by the first buffer 260. Thus, the second buffer 265 and the first buffer 260 can be respectively configured to meet driving requirements. In an example, the second buffer 265 can be configured to have a higher resolution and lower noises than the first buffer 260, due to the reason that the voltage Vo on the capacitor 281 may have a more stringent accuracy requirement than the gate voltage Vg on the capacitor 271.

Figure 3:
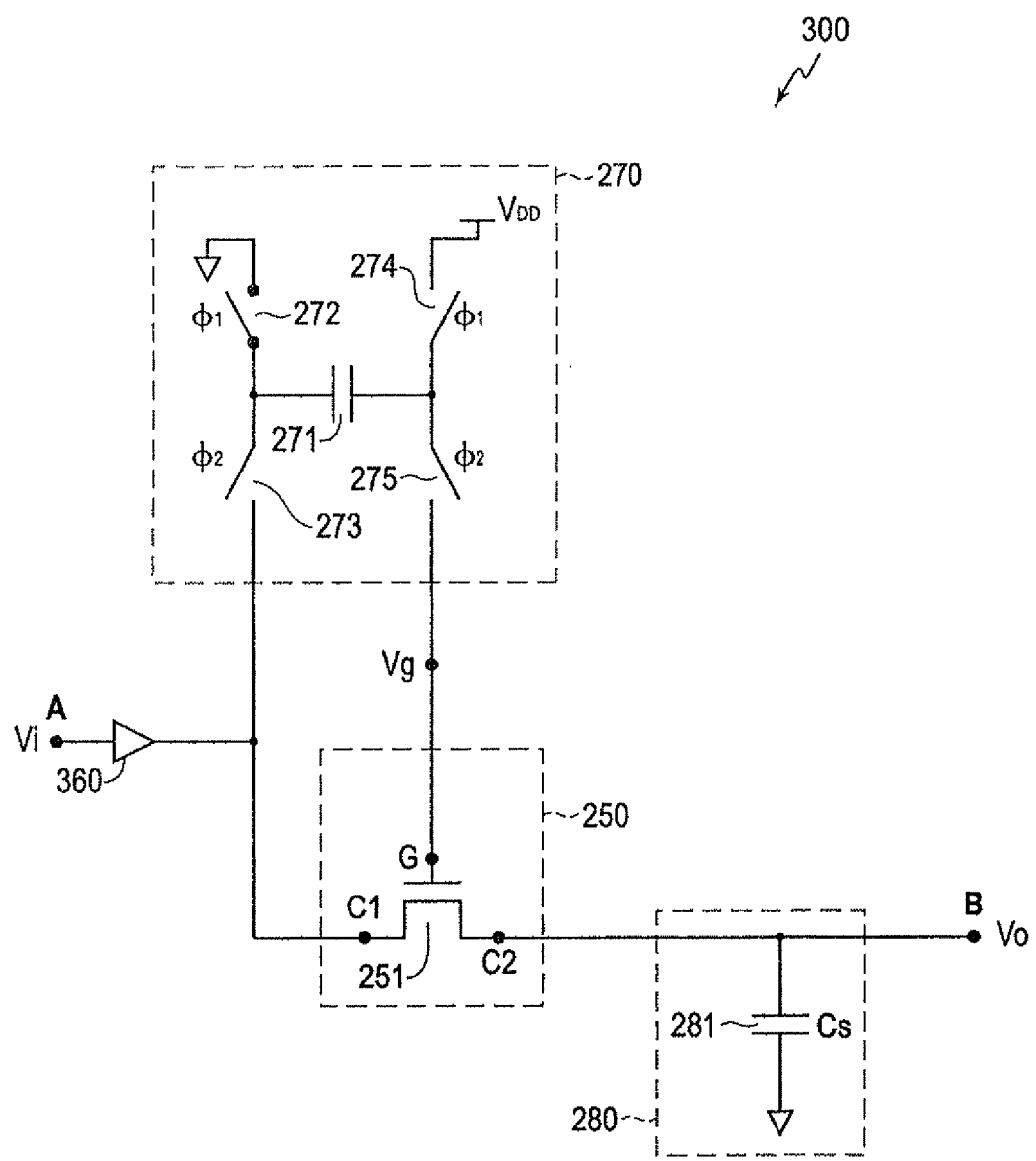
FIG. 3 shows a block diagram of a sampling circuit according to a related art.

FIG. 3 shows a block diagram of a sampling circuit example. The sampling circuit 300 can be configured similarly to the sampling circuit 230, except the sampling circuit 300 includes one buffer 360 that is configured to drive both the capacitor 271 and the capacitor 281 when the n-type MOS transistor 251 is configured in the track-mode. The buffer 360 may need to be designed to drive the capacitor 281 to satisfy an accuracy requirement of samples. In addition, the buffer 360 may need to be over-designed due to the need to drive the capacitor 271. For example, the buffer 360 may need to be over-designed to handle an instantaneous current surge at a beginning of a track-mode, when both the capacitor 271 and the capacitor 281 are coupled to the buffer 360. Further, the buffer 360 may need to be over-designed to satisfy a speed requirement that can be adversely affected by parasitic and wire capacitances that can be associated with the capacitor 271.

Figure 4:
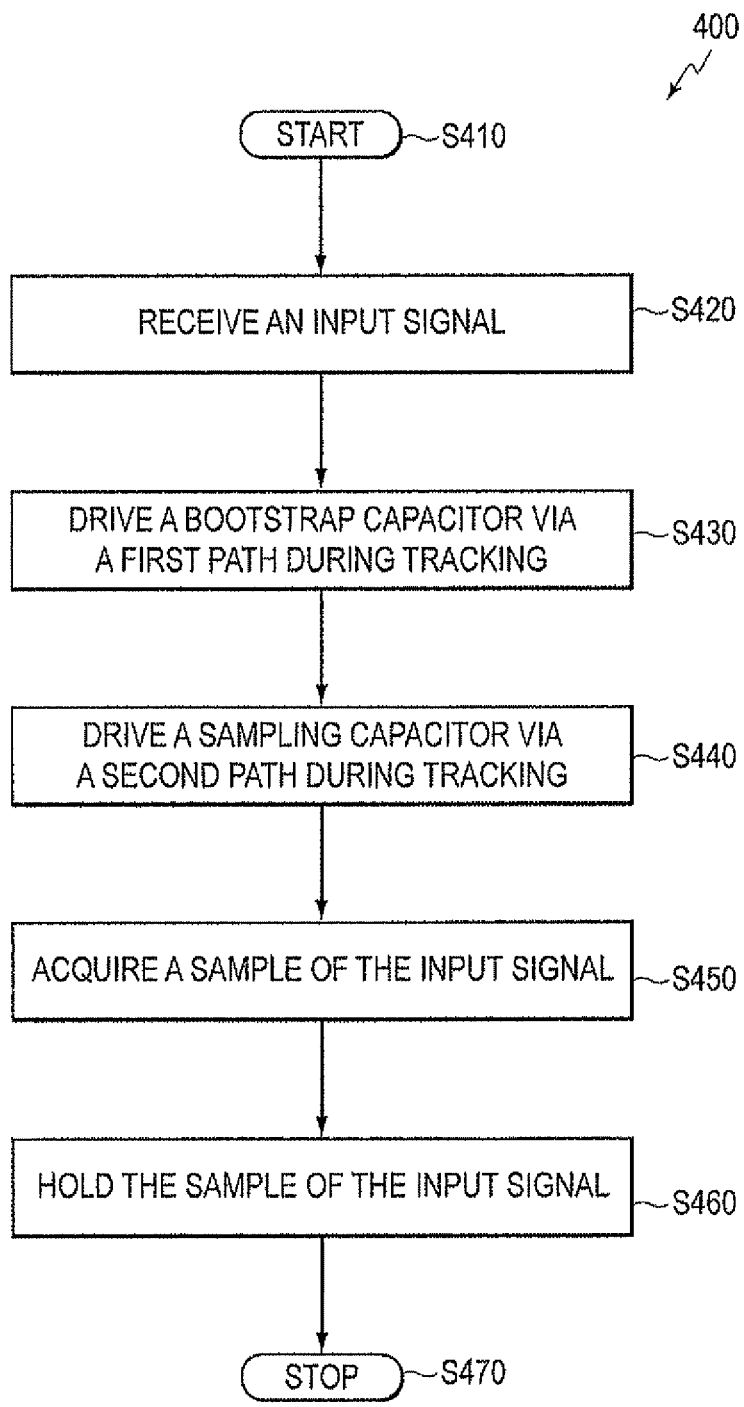
FIG. 4 shows a flow chart outlining a sampling process according to an embodiment of the disclosure.

FIG. 4 shows a flow chart outlining a sampling process 400.

At S420, a sampling circuit may receive an input signal. In the example of FIG. 2, the sampling circuit 230 may receive an input signal Vi.

At S430, the sampling circuit drives a bootstrap capacitor via a first path based on the input signal when the sampling circuit is configured into a track-mode. In the FIG. 2 example, the first buffer 260 can drive the bootstrap capacitor 271 based on the input signal Vi. The bootstrap capacitor 271 may adjust the gate voltage of the n-type MOS transistor 251 to configure the n-type MOS transistor 251 into the track-mode.

At S440, the sampling circuit drives a sampling capacitor via a second path based on the input signal when the sampling circuit is configured in the track-mode. The second path can be different from the first path. Thus, the sampling capacitor and the bootstrap capacitor can be driven separately, and the driving circuits for the two capacitors can be respectively configured to meet respective requirements. In the FIG. 2 example, the second buffer 265 can drive the sampling capacitor 281 based on the input signal Vi when the n-type MOS transistor 251 is configured in the track-mode. Therefore, the second buffer 265 and the first buffer 260 can be respectively configured to meet respective requirement. In an example, the second buffer 265 can be configured to have a higher accuracy and lower noises than the first buffer 260, due to the reason that the sampling voltage Vo on the sampling capacitor 281 may need to have a higher accuracy than the control voltage Vg on the bootstrap capacitor 271.

At S450, the sampling circuit acquires a sample of the input signal. In the FIG. 2 example, the gate voltage Vg of the n-type MOS transistor 251 can be configured from satisfying the channel forming condition to not-satisfying the channel forming condition in response to an edge of the second clock signal φ2. Thus, the n-type MOS transistor 251 can be turned off.

At S460, the sampling circuit holds the sample of the input signal. In the FIG. 2 example, the gate voltage Vg of the n-type MOS transistor 251 can be configured to maintain not-satisfying the channel forming condition, thus the voltage Vo on the sampling capacitor 281 can be maintained. Then the process proceeds to step S470, and terminates.

It is noted that the above process 400 is described for ease of description, the sampling circuit may perform some operations at the same time, and may repetitively perform the sampling process 400.

While the invention has been described in conjunction with the specific exemplary embodiments thereof, it is evident that many alternatives, modifications, and variations will be apparent to those skilled in the art. Accordingly, exemplary embodiments of the invention as set forth herein are intended to be illustrative, not limiting. There are changes that may be made without departing from the spirit and scope of the invention.

What is claimed is:

1. A sampling circuit, comprising:
   a switch having a control terminal and an n-type metal oxide semiconductor (MOS) transistor;
   a first driving module configured to output a first signal to the switch in response to a received analog input signal, the first signal being substantially equivalent to the received analog input signal; and
   a second driving module configured to output a second signal in response to the received analog input signal such that a control voltage on the control terminal is varied based on the received analog input signal, a substantially constant voltage difference being applied between the control terminal and the second driving module, the second signal being substantially equivalent to the received analog input signal, and a first error difference between a first output signal of the first driving module and the received analog input signal being smaller than a second error difference between a second output signal of the second driving module and the received analog input signal, wherein the first driving module is further configured to drive the first signal substantially equivalent to the analog input signal with a higher power than the second driving module driving the second signal.

2. The sampling circuit of claim 1, wherein the first driving module drives the first signal onto a channel terminal of the switch.

3. The sampling circuit of claim 2, wherein the channel terminal is a first channel terminal and the second signal is output to a bootstrap module, the bootstrap module is further configured to turn on the switch and cause an output voltage on a second channel terminal of the switch to track the first signal on the first channel terminal of the switch.

4. The sampling circuit of claim 1, wherein the second signal is output to a bootstrap module and the bootstrap module is configured to vary the control voltage.

5. The sampling circuit of claim 1, wherein the first driving module comprises an analog buffer.

6. The sampling circuit of claim 1, wherein the second driving module comprises an analog buffer.

7. A method for sampling, comprising:
   driving by a first driving module a first signal to a switch in response to a received analog input signal, the switch having an n-type metal oxide semiconductor (MOS) transistor;

driving the first signal substantially equivalent to the received analog input signal;

driving by a second driving module a second signal in response to the received analog input signal such that a control voltage on a control terminal of the switch is varied based on the received analog input signal, a substantially constant voltage difference being applied between the control terminal and the second driving module;

driving the second signal substantially equivalent to the received analog input signal, wherein a first error difference between a first output signal of the first driving module and the received analog input signal being smaller than a second error difference between a second output signal of the second driving module and the received analog input signal; and driving the first signal substantially equivalent to the analog input signal with a higher power than the second driving module driving the second signal.

8. The method of claim 7, wherein the first signal is driven onto a channel terminal of the switch.

9. The method of claim 8, wherein the channel terminal is a first channel terminal, further comprising:
driving the second signal to a bootstrap module;
turning on the switch by the bootstrap module; and
causing an output voltage on a second channel terminal of the switch to track the first signal on the first channel terminal of the switch.

10. The method of claim 7, further comprising:
driving the second signal to a bootstrap module; and
varying the control voltage by the bootstrap module.

11. The method of claim 7, wherein the first driving module comprises an analog buffer.

12. The method of claim 7, wherein the second driving module comprises an analog buffer.

* * * * *